United States Patent
Marcade et al.

(10) Patent No.: US 9,811,128 B2
(45) Date of Patent: Nov. 7, 2017

(54) STRUCTURAL SUBASSEMBLY FOR USE IN AN INFORMATION HANDLING SYSTEM CHASSIS

(71) Applicant: Dell Products L.P., Round Rock, TX (US)

(72) Inventors: Michael Dennis Marcade, Pflugerville, TX (US); Corey Dean Hartman, Hutto, TX (US); Darren B. Pav, Round Rock, TX (US); Juan M. Gonzalez, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 14/479,928

(22) Filed: Sep. 8, 2014

(65) Prior Publication Data
US 2016/0073554 A1    Mar. 10, 2016

(51) Int. Cl.
| | |
|---|---|
| H05K 5/03 | (2006.01) |
| G06F 1/20 | (2006.01) |
| H05K 5/02 | (2006.01) |
| G06F 1/18 | (2006.01) |

(52) U.S. Cl.
CPC ............... *G06F 1/20* (2013.01); *G06F 1/183* (2013.01); *G06F 1/185* (2013.01); *G06F 1/186* (2013.01); *H05K 5/023* (2013.01); *H05K 5/0208* (2013.01)

(58) Field of Classification Search
CPC ...... H05K 7/20709; H05K 7/20; H05K 7/183; H05K 5/0208; H05K 5/023; H05K 5/0217

USPC .......... 211/26, 26.2, 40, 41.12, 41.17, 41.18, 211/189; 312/223.2, 223.1; 361/679.01, 361/679.02, 679.33–679.39, 724, 727, 361/679.31, 679.46, 679.48, 688, 695
See application file for complete search history.

(56) References Cited

U.S. PATENT DOCUMENTS

| | | | | |
|---|---|---|---|---|
| 3,548,425 | A | * 12/1970 | Goldstein | ............... F16B 12/34 312/263 |
| 4,725,244 | A | * 2/1988 | Chewning | ............... G06F 1/181 29/830 |

(Continued)

OTHER PUBLICATIONS

U.S. Appl. No. 14/474,857, "Systems and Methods for Insertion of an Information Handling Resource in an Information Handling System", filed Sep. 2, 2014, 51 pages.

*Primary Examiner* — Brent W Herring
(74) *Attorney, Agent, or Firm* — Jackson Walker L.L.P.

(57) ABSTRACT

A structural subassembly for use in an information handling system chassis may include a first portion, a second portion, a common wall, and one or more mechanical features. The first portion may be configured to receive one or more of a first type of information handling resource. The second portion may be configured to receive one or more of a second type of information handling resource. The common wall may divide the first portion from the second portion. The one or more mechanical features may be configured to engage with one or more respective mechanical features of the information handling system chassis in order to perform at least one of guiding of the subassembly relative to the information handling system chassis during insertion or removal of the subassembly into or from the information handling system chassis and retention of the subassembly relative to the information handling system chassis.

14 Claims, 10 Drawing Sheets

(56) References Cited

U.S. PATENT DOCUMENTS

| | | | | |
|---|---|---|---|---|
| 4,937,806 | A * | 6/1990 | Babson | G11B 33/025 360/137 |
| 5,214,574 | A * | 5/1993 | Chang | G06F 1/1628 190/102 |
| 5,224,019 | A * | 6/1993 | Wong | G06F 1/184 361/679.32 |
| 5,297,009 | A * | 3/1994 | Gelez | H05K 7/1411 211/41.17 |
| 5,313,596 | A * | 5/1994 | Swindler | G06F 1/1616 361/679.38 |
| 5,477,415 | A * | 12/1995 | Mitcham | G06F 1/1632 361/679.42 |
| 5,527,104 | A * | 6/1996 | Moss | G06F 1/181 312/223.2 |
| 5,845,978 | A * | 12/1998 | Jung | G06F 1/181 16/405 |
| 5,852,739 | A * | 12/1998 | Radloff | G06F 1/187 361/679.33 |
| 5,949,645 | A * | 9/1999 | Aziz | H05K 7/1421 165/104.33 |
| 5,949,652 | A * | 9/1999 | McAnally | G06F 1/184 361/725 |
| 6,005,770 | A * | 12/1999 | Schmitt | H05K 7/2019 361/679.48 |
| 6,029,183 | A * | 2/2000 | Jenkins | G06F 1/16 361/679.21 |
| 6,029,215 | A * | 2/2000 | Watts, Jr. | G06F 1/1632 361/679.32 |
| 6,052,281 | A * | 4/2000 | Hardt | G06F 1/181 361/679.33 |
| 6,137,684 | A * | 10/2000 | Ayd | H05K 7/1411 361/608 |
| 6,222,736 | B1 * | 4/2001 | Sim | G06F 1/184 361/727 |
| 6,231,144 | B1 * | 5/2001 | Chen | H05K 7/1411 312/223.2 |
| 6,426,876 | B1 * | 7/2002 | Shearman | H05K 5/023 211/17 |
| 7,227,747 | B2 * | 6/2007 | Walker | E05B 73/0082 361/679.37 |
| 7,576,977 | B2 * | 8/2009 | Signer | H05K 7/1487 211/26 |
| 7,675,754 | B2 * | 3/2010 | Barina | H05K 7/1411 361/727 |
| 7,771,218 | B2 * | 8/2010 | Jaramillo | H05K 7/1492 439/157 |
| 8,231,396 | B2 * | 7/2012 | Kangas | H05K 7/1411 361/727 |
| 8,611,103 | B2 * | 12/2013 | Thomas | H05K 7/1411 361/679.58 |
| 9,215,828 | B1 * | 12/2015 | Yang | H05K 7/1487 |
| 9,310,860 | B2 * | 4/2016 | Anuez | G06F 1/181 |
| 2003/0063454 | A1 * | 4/2003 | Wilson | G06F 1/184 361/796 |
| 2004/0240186 | A1 * | 12/2004 | Su | G06F 1/181 361/727 |
| 2005/0152106 | A1 * | 7/2005 | Coster | G06F 1/181 361/679.58 |
| 2005/0157463 | A1 * | 7/2005 | Hsu | G06F 1/187 361/679.33 |
| 2006/0044775 | A1 * | 3/2006 | Hoshino | H05K 7/1418 361/796 |
| 2006/0082965 | A1 * | 4/2006 | Walker | E05B 73/0082 361/679.41 |
| 2006/0274515 | A1 * | 12/2006 | Arthur | H05K 7/1424 361/796 |
| 2009/0080165 | A1 * | 3/2009 | Barina | H05K 7/1411 361/747 |
| 2009/0103258 | A1 * | 4/2009 | Signer | H05K 7/1487 361/679.33 |
| 2009/0273901 | A1 * | 11/2009 | Jaramillo | H05K 7/1492 361/679.58 |
| 2012/0020016 | A1 * | 1/2012 | Cheng | G06F 1/184 361/679.48 |
| 2013/0107424 | A1 * | 5/2013 | Thomas | H05K 7/1489 361/679.01 |
| 2014/0092550 | A1 * | 4/2014 | Anuez | G06F 1/181 361/679.48 |
| 2015/0146372 | A1 * | 5/2015 | French, Jr. | H05K 7/1489 361/679.58 |

* cited by examiner

STRUCTURAL SUBASSEMBLY FOR USE IN AN INFORMATION HANDLING SYSTEM CHASSIS

TECHNICAL FIELD

The present disclosure relates to modular information handling systems. More specifically, embodiments of the disclosure provide systems and methods for insertion of modular information handling resources in an information handling system chassis.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources from the chassis.

In an information handling system, a circuit board may mechanically and electrically couple to another circuit board (e.g., a midplane or motherboard) via an edge connector that is coupled to a slot of the other circuit board, with additional mechanical support provided between the circuit board and a chassis housing components of the information handling system. Such additional support may be required where the mechanical support provided by coupling the edge connector to its corresponding slot is insufficient. For instance, in a circuit board which functions as a backplane for receiving modular memory modules, such structural attachment between circuit board and chassis may be desired to ensure proper alignment for deflection and sufficient structural support to maintain electrical coupling.

The density of components placed in information handling systems continues to increase, and such increase leads to space constraints, as manufacturers of information handling systems attempt to maintain and/or reduce the physical footprint of information handling systems. Thus, it may be desirable to reduce the volume of space required by a physical structure of a chassis while maintaining adequate mechanical support for information handling resources of the information handling system chassis.

SUMMARY

In accordance with the teachings of the present disclosure, the disadvantages and problems associated with traditional modular information handling system designs and architectures may be substantially reduced or eliminated.

In accordance with embodiments of the present disclosure, a structural subassembly for use in an information handling system chassis may include a first portion, a second portion, a common wall, and one or more mechanical features. The first portion may be configured to receive one or more of a first type of information handling resource. The second portion may be configured to receive one or more of a second type of information handling resource. The common wall may divide the first portion from the second portion. The one or more mechanical features may be configured to engage with one or more respective mechanical features of the information handling system chassis in order to perform at least one of guiding of the subassembly relative to the information handling system chassis during insertion or removal of the subassembly into or from the information handling system chassis and retention of the subassembly relative to the information handling system chassis.

In accordance with these and other embodiments of the present disclosure, a method may include providing a structural subassembly for use in an information handling system chassis, the subassembly comprising a first portion configured to receive one or more of a first type of information handling resource and a second portion configured to receive one or more of a second type of information handling resource. The method may also include providing a common wall dividing the first portion from the second portion. The method may further include providing within the subassembly one or more mechanical features configured to engage with one or more respective mechanical features of the information handling system chassis in order to perform at least one of guiding of the subassembly relative to the information handling system chassis during insertion or removal of the subassembly into or from the information handling system chassis and retention of the subassembly relative to the information handling system chassis.

In accordance with these and other embodiments of the present disclosure, an information handling system may include a chassis and a structural subassembly for use in an information handling system chassis. The structural subassembly may include a first portion, a second portion, a common wall, and one or more mechanical features. The first portion may be configured to receive one or more of a first type of information handling resource. The second portion may be configured to receive one or more of a second type of information handling resource. The common wall may divide the first portion from the second portion. The one or more mechanical features may be configured to engage with one or more respective mechanical features of the chassis in order to perform at least one of guiding of the subassembly relative to the chassis during insertion or removal of the subassembly into or from the chassis and retention of the subassembly relative to the chassis.

In accordance with these and other embodiments of the present disclosure, a system may include a top plate, a bottom plate mechanically coupled to the top plate; a plurality of first connectors and a second connector. The plurality of first connectors may be located on an exterior surface of the top plate such that each of the plurality of first connectors is configured to electrically couple to a corresponding connector of an information handling resource as the information handling resource is mechanically supported by the top plate. The second connector may be electrically coupled to each of the plurality of first connectors and may be located on an exterior surface of the bottom plate such that the second connector is configured to electrically couple to a circuit board.

In accordance with these and other embodiments of the present disclosure, a method may include providing a top plate. The method may also include mechanically coupling a bottom plate to the top plate. The method may further include locating a plurality of first connectors on an exterior surface of the top plate such that each of the plurality of first connectors is configured to electrically couple to a corresponding connector of an information handling resource as the information handling resource is mechanically supported by the top plate. The method may additionally include electrically coupling a second connector to each of the plurality of first connectors and locating the second connector on an exterior surface of the bottom plate such that the second connector is configured to electrically couple to a circuit board.

In accordance with these and other embodiments of the present disclosure an information handling system may include a circuit board and a subsystem. The subsystem may include a top plate, a bottom plate mechanically coupled to the top plate, a plurality of first connectors and a second connector. The plurality of first connectors may be located on an exterior surface of the top plate such that each of the plurality of first connectors is configured to electrically couple to a corresponding connector of an information handling resource as the information handling resource is mechanically supported by the top plate. The second connector may be electrically coupled to each of the plurality of first connectors and may be located on an exterior surface of the bottom plate such that the second connector electrically couples to the circuit board.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-9, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

As used herein, the term "circuit board" may broadly refer to printed circuit boards (PCBs), printed wiring boards (PWBs), printed wiring assemblies (PWAs), etched wiring boards, and/or any other board or similar physical structure operable to mechanically support and electrically couple electronic components. A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

Figure 1:
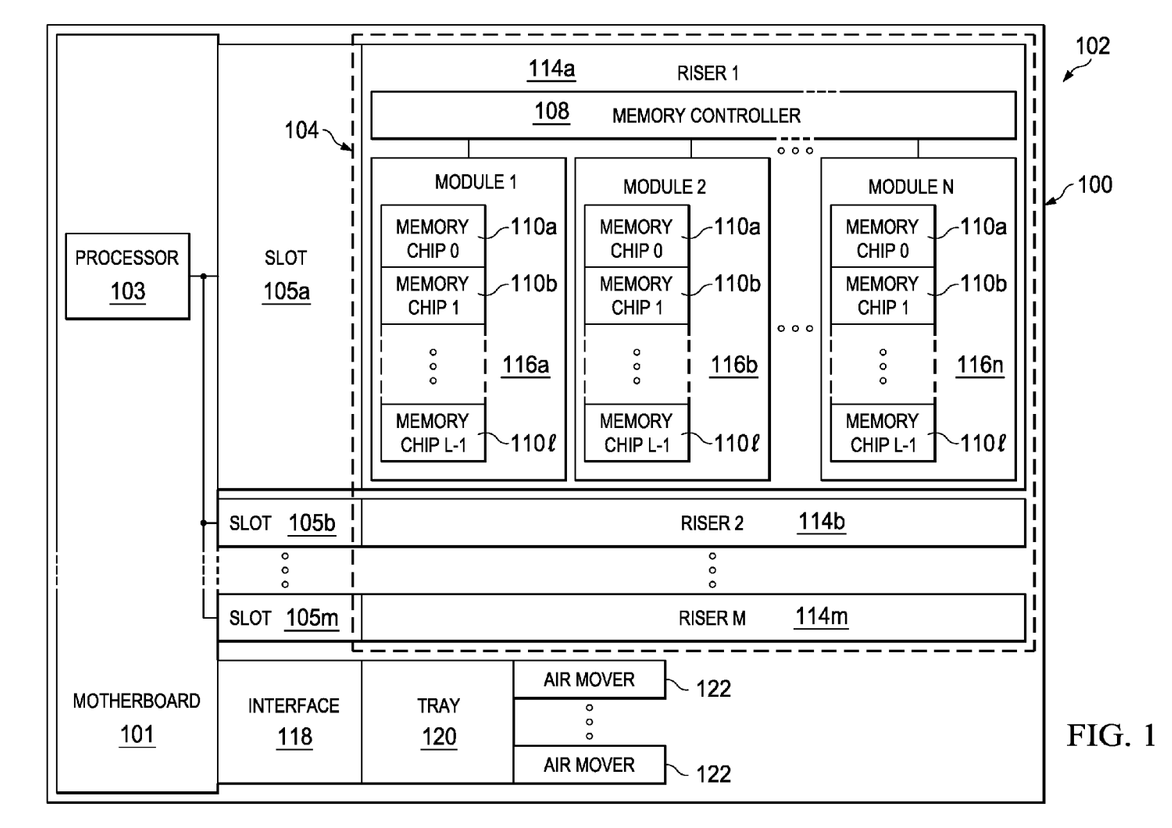
FIG. 1 illustrates a block diagram of selected components of an example information handling system, in accordance with embodiments of the present disclosure.

FIG. 1 illustrates a block diagram of an example information handling system 102 in accordance with certain embodiments of the present disclosure. In some embodiments, information handling system 102 may comprise a server for housing one or more modular information handling systems or "blades." In other embodiments, information handling system 102 may comprise a personal computer (e.g., a desktop computer or a portable computer). As depicted in FIG. 1, information handling system 102 may include a chassis 100 housing a motherboard 101, a memory system 104 communicatively coupled to motherboard 101 via one or more slots 105, and one or more air movers 122 electrically coupled to motherboard 101 via an interface 118 and a tray 120.

Chassis 100 may comprise an enclosure that serves as a container for one or more information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In some embodiments, chassis 100 may be configured to hold and/or provide power to a plurality of information handling systems and/or information handling resources.

Motherboard 101 may include a circuit board configured to provide structural support for one or more information handling resources of information handling system 102 and/or electrically couple one or more of such information handling resources to each other and/or to other electric or electronic components external to information handling system 102. As shown in FIG. 1, motherboard 101 may include a processor 103 and one or more slots 105 (e.g., slots 105a-105m) communicatively coupled to processor 103 (e.g., via a communication bus).

Processor 103 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored and/or communicated by one or more of memory system 104 and/or another component of information handling system 102.

A memory slot 105 may include any system, device, or apparatus configured to receive a memory riser 114 in order to electrically couple such memory riser 114 and components thereof to processor 103. Thus, memory slot 105 may comprise an electrical/electronic connector configured to engage with a corresponding electrical/electronic connector of a memory riser 114.

Memory system 104 may be communicatively coupled to processor 103 via the one or more memory slots 105 and may comprise any system, device, or apparatus operable to retain program instructions or data for a period of time (e.g., computer-readable media). Memory system 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory system 104 may comprise dynamic random access memory (DRAM).

As shown in FIG. 1, memory system 104 may include a plurality of memory risers 114 (e.g., memory risers 114a-114m). Each memory riser 114 may comprise a circuit board having mounted thereon one or more memory controllers 108 and configured to receive one or more memory modules 116 (e.g., memory modules 116-116n). In some embodiments, a memory riser 114 may be a modular component which may be easily inserted into and removed from a corresponding slot 105 by a technician or other user of information handling system 102. Accordingly, a memory riser 114 may include mechanical components for facilitating such insertion and removal, as is described in greater detail below in this disclosure. In these and other embodiments, a memory riser 114 may include thermal components for cooling or directing heat away from other components (e.g., memory controllers 108 and/or memory modules 116) disposed on such memory riser 114, as is described in greater detail below in this disclosure. In some embodiments, a memory riser 114 may have structure and/or features identical or similar to that of the memory riser described in U.S. patent application Ser. No. 14/474,857, filed Sep. 2, 2014, entitled "Systems and Methods for Insertion of an Information Handling Resource in an Information Handling System," assigned to the same assignee as the present application, and incorporated by reference herein.

A memory controller 108 may comprise any system, device, or apparatus configured to manage and/or control its associated memory riser 114. For example, memory controller 108 may be configured to read data from and/or write data to memory modules 116 comprising its associated memory riser 114. Additionally or alternatively, memory controller 108 may be configured to refresh memory modules 116 and/or memory chips 110 thereof in embodiments in which a memory riser 114 comprises DRAM. Although memory controller 108 is shown in FIG. 1 as an integral component of a memory riser 114, memory controller 108 may be separate from a memory riser 114 and/or may be an integral portion of another component of information handling system 102 (e.g., memory controller 108 may be integrated into processor 103 or disposed on motherboard 101).

Each memory module 116 may comprise a circuit board having mounted thereon one or more memory chips 110 (e.g., memory chips 110a-110l). In some embodiments, a memory module 116 may be a modular component which may be easily inserted into and removed from a corresponding slot of a memory riser 114 by a technician or other user of information handling system 102. Thus, to remove a particular memory module 116, a technician or other user of information handling system 102 may first remove from information handling system 102 a memory riser 114 in which the particular memory module 116 is disposed, and then remove the particular memory module 116 from such memory riser 114.

Each memory chip 110 may include a packaged integrated circuit configured to comprise a plurality of memory cells for storing data. In some embodiments, a memory chip 110 may include dynamic random access memory (DRAM).

Interface 118 may comprise any system, device, or apparatus configured to communicatively couple an electronic and/or electrical component to motherboard 101, such that motherboard 101 may send and/or receive signals (e.g., control and/or data signals) to and/or from such electrical component, and/or route a source of electrical energy for operation of such electrical component. In some embodiments, interface 118 may comprise an electrical connector mechanically coupled to motherboard 101 and configured to receive a corresponding mating connector. In these and other embodiments, interface 118 may comprise a hot-pluggable connector. In these and other embodiments, interface 118 may comprise a blind-mate connector.

Tray 120 may comprise any system, device, or apparatus to provide mechanical support to one or more information handling systems (e.g., one or more air movers 122) and to electrically couple each of such one or more information handling systems to interface 118. Although the embodiments represented by FIG. 1 depict tray 120 as interfacing between interface 118 and air movers 122, in other embodiments, a tray 120 may mechanically support and electrically couple information handling resources other than air movers 122.

An air mover 122 may be communicatively coupled to processor 103 (e.g., via motherboard 101, interface 118, and tray 120) or another component for controlling such air mover 122, and may include any mechanical or electromechanical system, apparatus, or device operable to move air and/or other gases. In some embodiments, an air mover 122 may comprise a fan (e.g., a rotating arrangement of vanes or blades which act on the air). In other embodiments, an air mover 122 may comprise a blower (e.g., centrifugal fan that employs rotating impellers to accelerate air received at its intake and change the direction of the airflow). In these and other embodiments, rotating and other moving components of air mover 122 may be driven by a motor (not shown). The rotational speed of the motor may be controlled by one or more control signals to such air mover 122 via tray 120. In operation, air mover 122 may cool information handling resources of information handling system 102 by drawing cool air into chassis 100 from outside chassis 100, expel warm air from inside chassis 100 to the outside of chassis 100, and/or move air across one or more heatsinks (not explicitly shown) internal to chassis 100 to cool one or more information handling resources.

Figure 2:
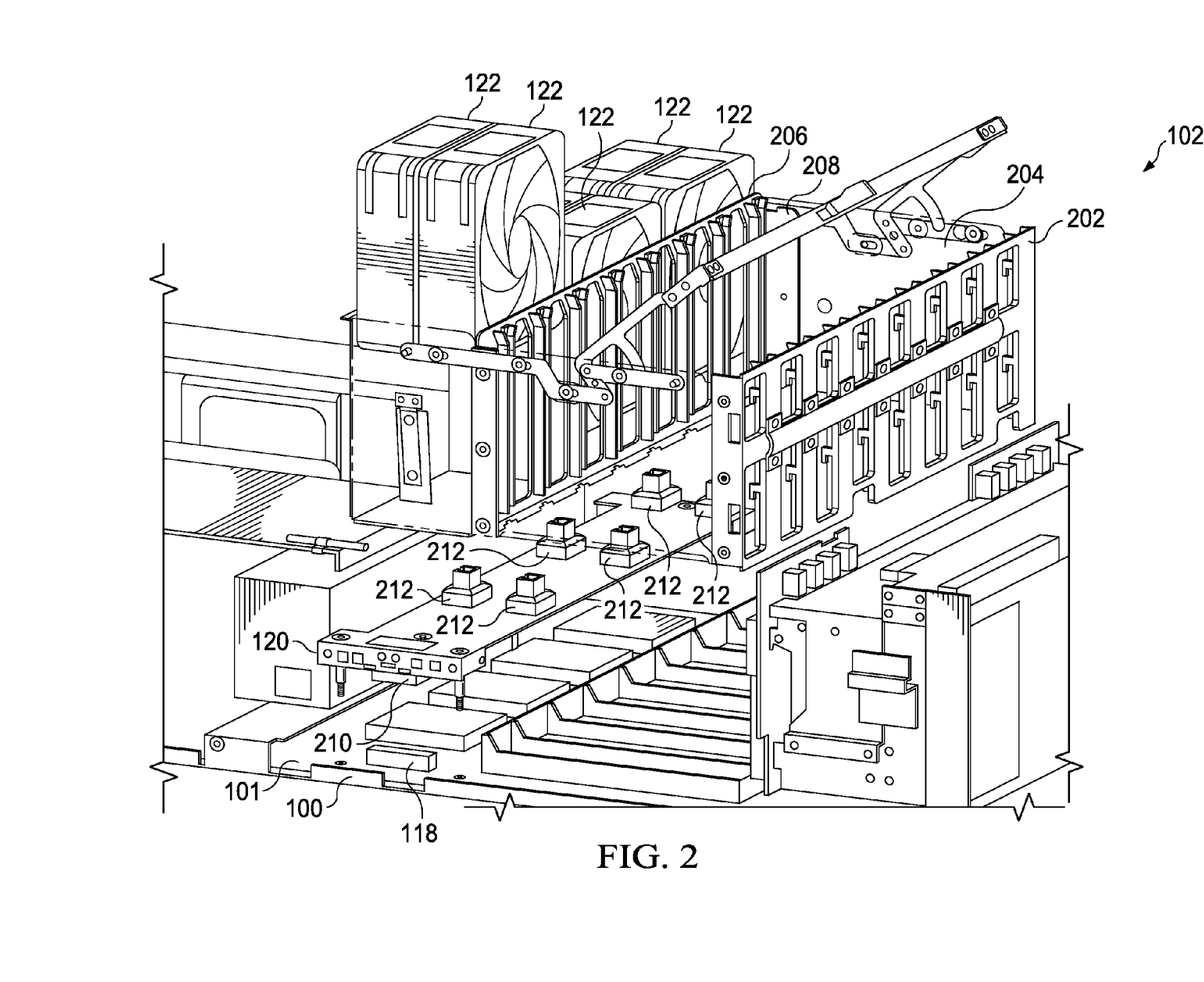
FIG. 2 illustrates a perspective view of selected components of the information handling system depicted in FIG. 1, with portions of the chassis of such information handling system cut away for purposes of clarity and exposition, in accordance with embodiments of the present disclosure.

FIG. 2 illustrates a perspective view of selected components of information handling system 102, with portions of the exterior housing of chassis 100 removed for purposes of clarity and exposition, in accordance with embodiments of the present disclosure. As shown in FIG. 2, information handling system 102 may include a readily removable subassembly 202 configured to mechanically couple to chassis 100, as further described herein. In FIG. 2, subassembly 202 is shown as removed from chassis 100, but aligned above chassis 100 for insertion therein. Subassembly 202 may be configured to mechanically support and/or guide a plurality of different types of information handling resources (e.g., information handling resources with different form factors and/or functionality). For example, in embodiments represented by FIG. 2, subassembly 202 may include a memory riser portion 204 and an air mover portion 206 divided by a common wall 208. Memory riser portion 204 may comprise one or more features, described in greater detail elsewhere in this disclosure, for mechanically supporting and/or guiding memory risers 114 (e.g., providing mechanical guides for user insertion or removal of modular memory risers 114 of or from corresponding slots 105). Similarly, air mover portion 206 may comprise one or more features, described in greater detail elsewhere in this disclosure, for mechanically supporting and/or guiding air movers 122 (e.g., providing mechanical guides for user insertion or removal of modular air movers 122 of or from respective slots). Wall 208 may comprise any suitable mechanical structure for separating memory riser portion 204 and air mover portion 206, and may itself include one or more features for mechanically supporting and/or guiding memory risers 114 and/or air movers 122. The various features and functions of subassembly 202 are described in greater detail below with reference to FIGS. 4A-9.

FIG. 2 also depicts tray 120 uncoupled from motherboard 101, but aligned above motherboard 101 for coupling thereto. As shown in FIG. 2, tray 120 may include a tray-to-motherboard connector 210 and a plurality of air mover connectors 212. Tray-to-motherboard connector 210 may comprise an electrical connector configured to mate with interface 118 in order to electrically couple tray 120 to motherboard 101 via interface 118. In some embodiments, tray 120 may include only a single tray-to-motherboard connector 210. The various electrical paths of tray-to-motherboard connector 210 may fan out to the plurality of air mover connectors 212, as described in greater detail below, such that each air mover connector 212 may couple an air mover 122 coupled thereto to motherboard 101 via such air mover connector 212, tray-to-motherboard connector 210, and interface 118.

Figure 3A:
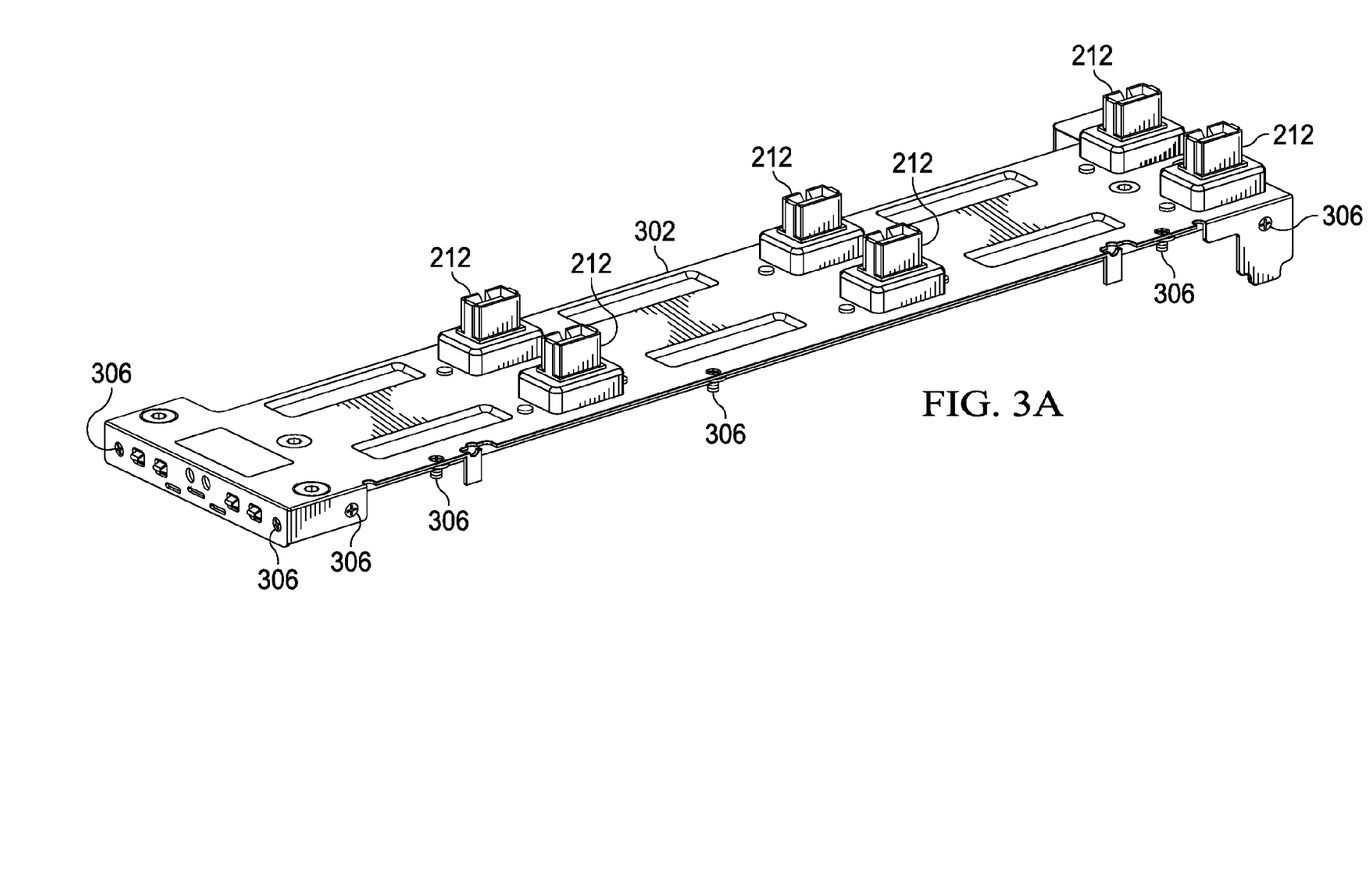
FIG. 3A illustrates a perspective view of selected components of an example tray, in accordance with embodiments of the present disclosure.
Figure 3B:
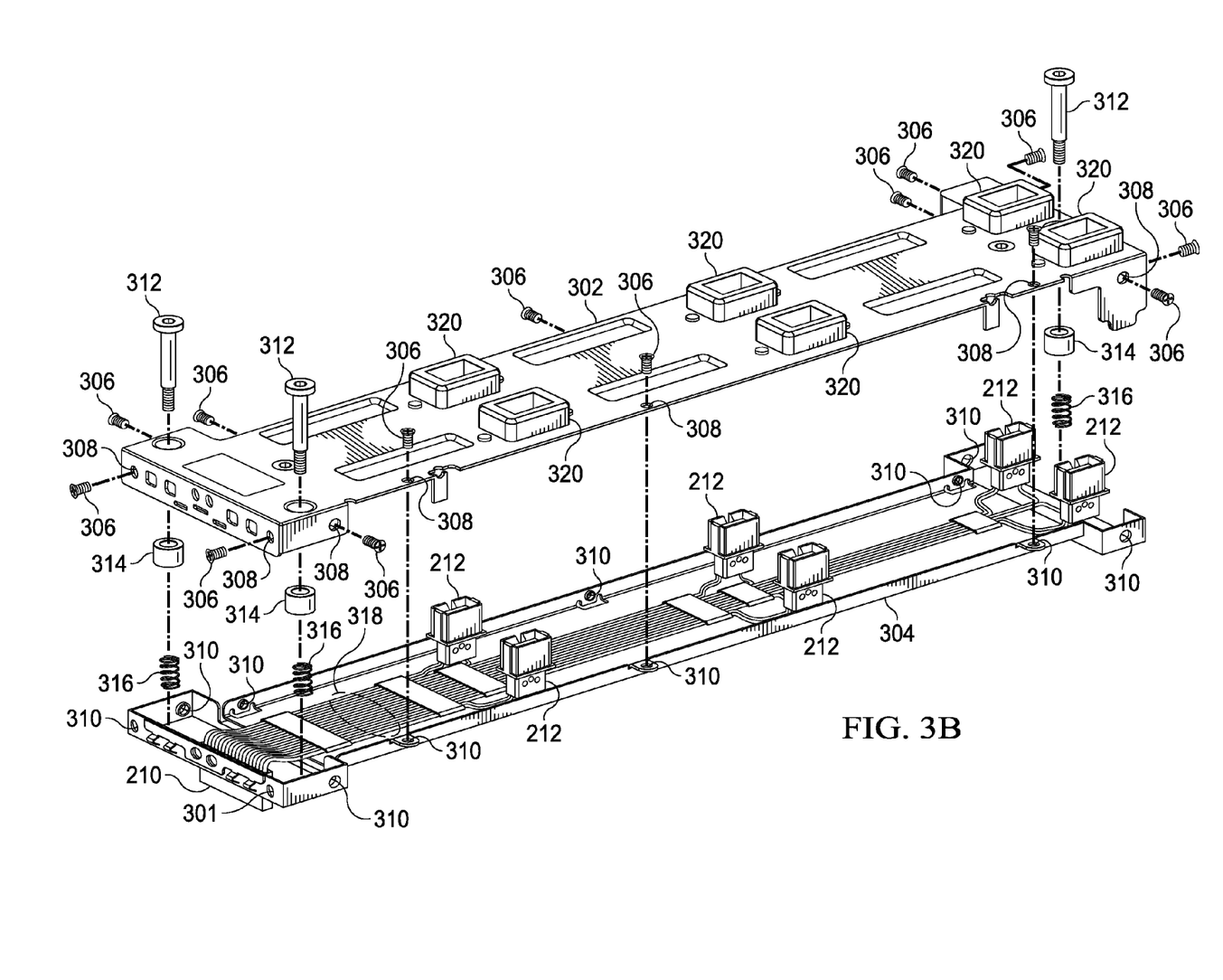
FIG. 3B illustrates an exploded perspective view of selected components of an example tray, in accordance with embodiments of the present disclosure.

FIG. 3A illustrates a perspective view of selected components of an example tray 120, while FIG. 3B illustrates an exploded perspective view of selected components of an example tray 120, in accordance with embodiments of the present disclosure. As shown in FIGS. 3A and 3B, tray 120 may comprise a top plate 302 and a bottom plate 304. Top plate 302 and bottom plate 304 may comprise openings 308 and 310, respectively, configured to receive a screw 306 or other fastener for mechanically coupling top plate 302 to bottom plate 304. Top plate 302 may also include openings 320 through each of which a respective air mover connector 212 may pass. Bottom plate 304 may also include an opening (not labeled in FIGS. 3a and 3B) in which tray-to-motherboard connector 210 may pass or which through wires 318 may pass to electrically couple to tray-to-motherboard connector 210. Each wire 318 may extend from tray-to-motherboard connector 210 to a respective air mover connector 212, such that each air mover connector 212 may be electrically coupled to tray-to-motherboard connector 210 via a set of one or more wires which may provide electrical current for operation, one or more signals for control, and/or other functions. Thus, top plate 302 and bottom plate 304, when coupled to one another, may define a plenum which serves as a single, integrated wiring harness for wires 318 carrying power and/or signals to and/or from air mover connectors 212.

As shown in FIGS. 3A and 3B, tray 120 may include screws 312, spacers 314, compression springs 316, and/or other fastening devices for rigidly coupling tray 120 to motherboard 101 and ensuring electrical coupling of tray-to-motherboard connector 210 to interface 118.

In operation, tray 120 may mechanically couple one or more air movers 122 to motherboard 101 while providing mechanical support of such air movers 122. In some embodiments, tray 120 may enable greater density of information handling resources within chassis 100. For example, because tray 120 enables coupling of multiple air movers 122 to motherboard 101 via a single connector (i.e., interface 118) of motherboard 101 instead of a connector on motherboard 101 for each air mover 122, space may be available on portions of motherboard 101 below tray 120 for placement of other information handling resources (e.g., processors 103) disposed on motherboard 101. In addition, because tray 120 enables many air movers 122 to be coupled to motherboard 101 via a single connector (i.e., interface 118), a design of a tray 120 and/or air movers 122 (e.g., numbers of air movers 122, locations of air mover connectors 212, etc.) may be modified without necessity of redesigning a layout of motherboard 101 (e.g., reconfiguring circuit board routing) in order to account for such modifications. In addition, tray 120 may be readily removable by a technician or other user, allowing use of space above motherboard 101 while still allowing service access to the portion of motherboard 101 that sits below tray 120.

Although FIGS. 2, 3A, and 3B depict tray 120 supporting and electrically coupling air movers 122 to motherboard 101, tray 120 may be employed to support and electrically couple any other suitable type of information handling resource to motherboard 101.

Figure 4A:
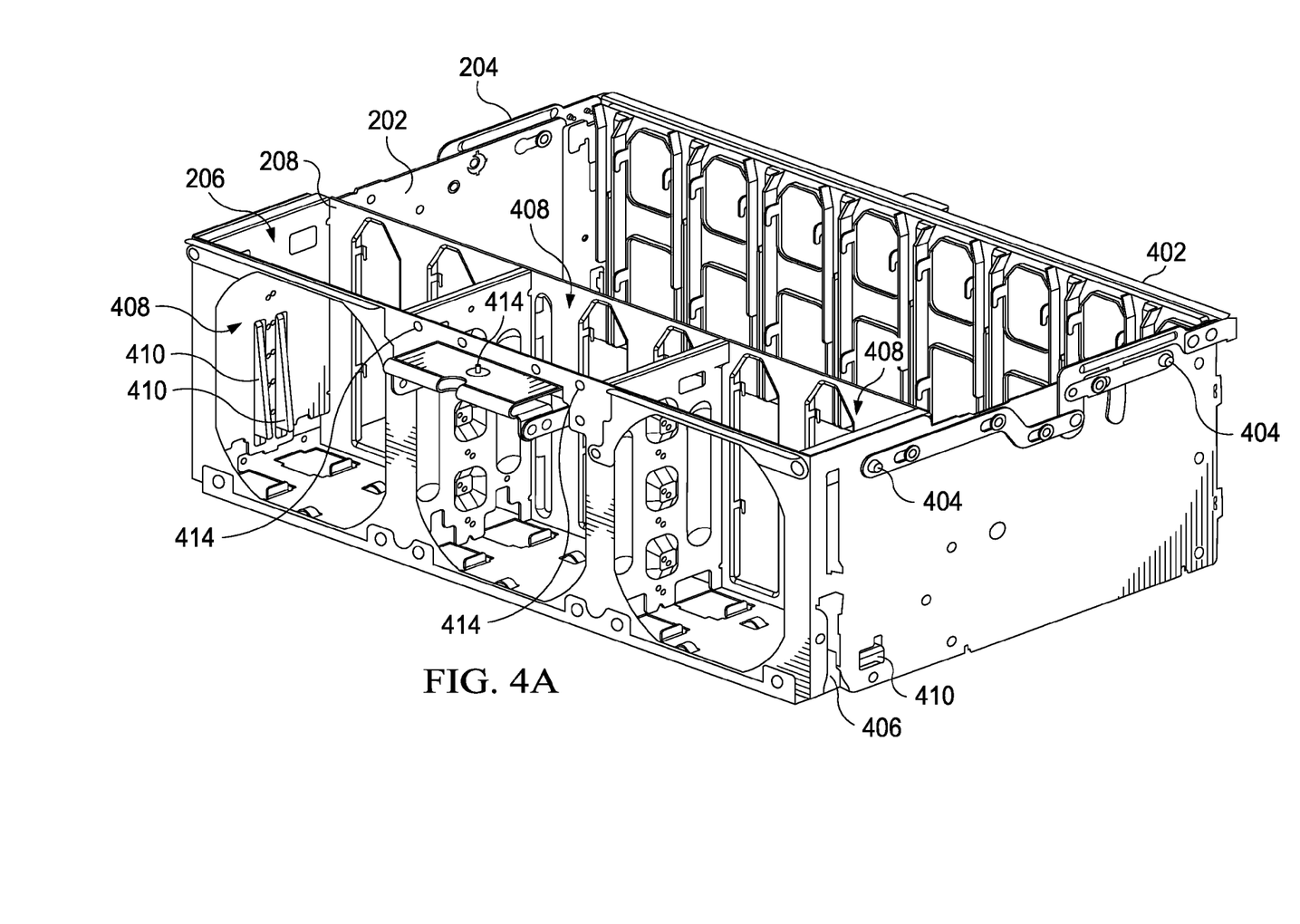
FIGS. 4A and 4B each illustrate a perspective view of an example subassembly, in accordance with embodiments of the present disclosure.
Figure 4B:
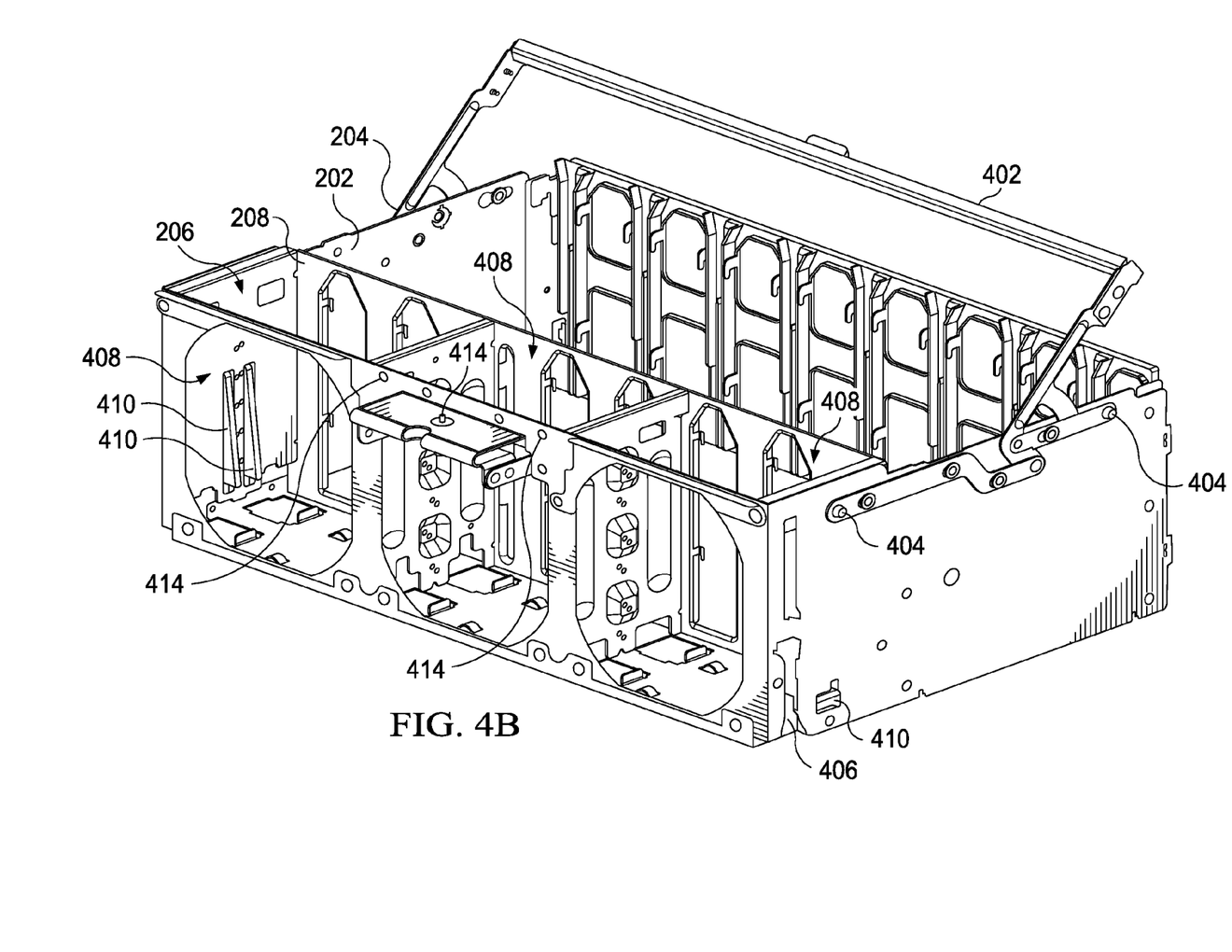
Figure 5:
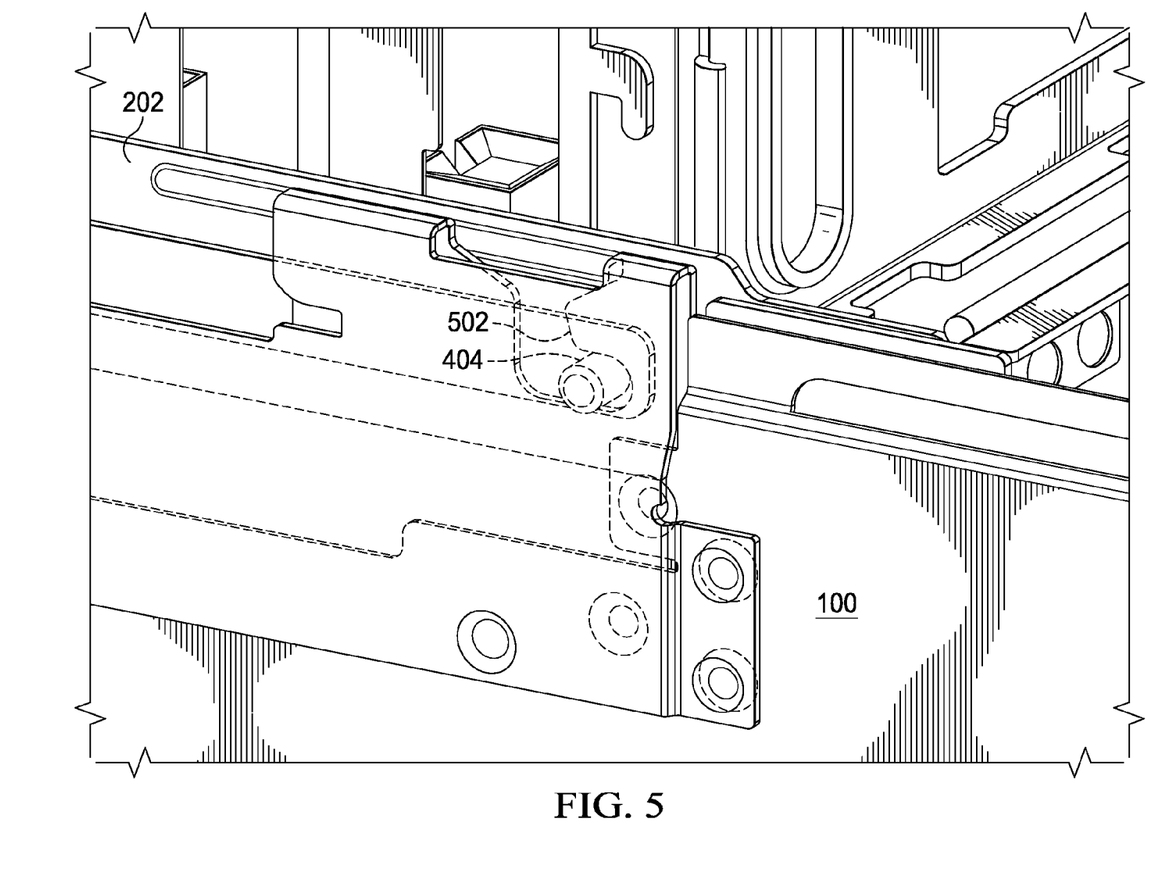
FIG. 5 illustrates a standoff of the example subassembly of FIGS. 4A and 4B engaged with a corresponding slot of a chassis, in accordance with embodiments of the present disclosure.

FIGS. 4A and 4B each illustrate a perspective view of example subassembly 202, in accordance with embodiments of the present disclosure. As is described in greater detail below, subassembly 202 may include features for guiding, alignment, and retention of subassembly 202 within chassis 100, as well as features for guiding, alignment, and retention of information handling resources (e.g., memory risers 114 and/or air movers 122) within subassembly 202. For example, as shown in FIGS. 4A and 4B, subassembly 202 may include a handle 402 which may be movable relative to the rest of subassembly 202 and which may be mechanically coupled to one or more standoffs 404 configured to engage with a corresponding feature of chassis 100 to mechanically retain subassembly 202 within chassis 100. Such engagement is depicted in FIG. 5, which shows a standoff 404 engaged with a corresponding slot 502 of chassis 100 to retain subassembly 202 in chassis 100. Handle 402 may be mechanically coupled to standoffs 404 such that in a closed position of handle 402 (e.g., FIG. 4A), standoffs 404 engage with slots 502 to retain subassembly 202 in chassis 100, while in an open position of handle 402 (e.g., FIG. 4B), standoffs 404 may be in a position to be inserted into or removed from slots 502.

Figure 6:
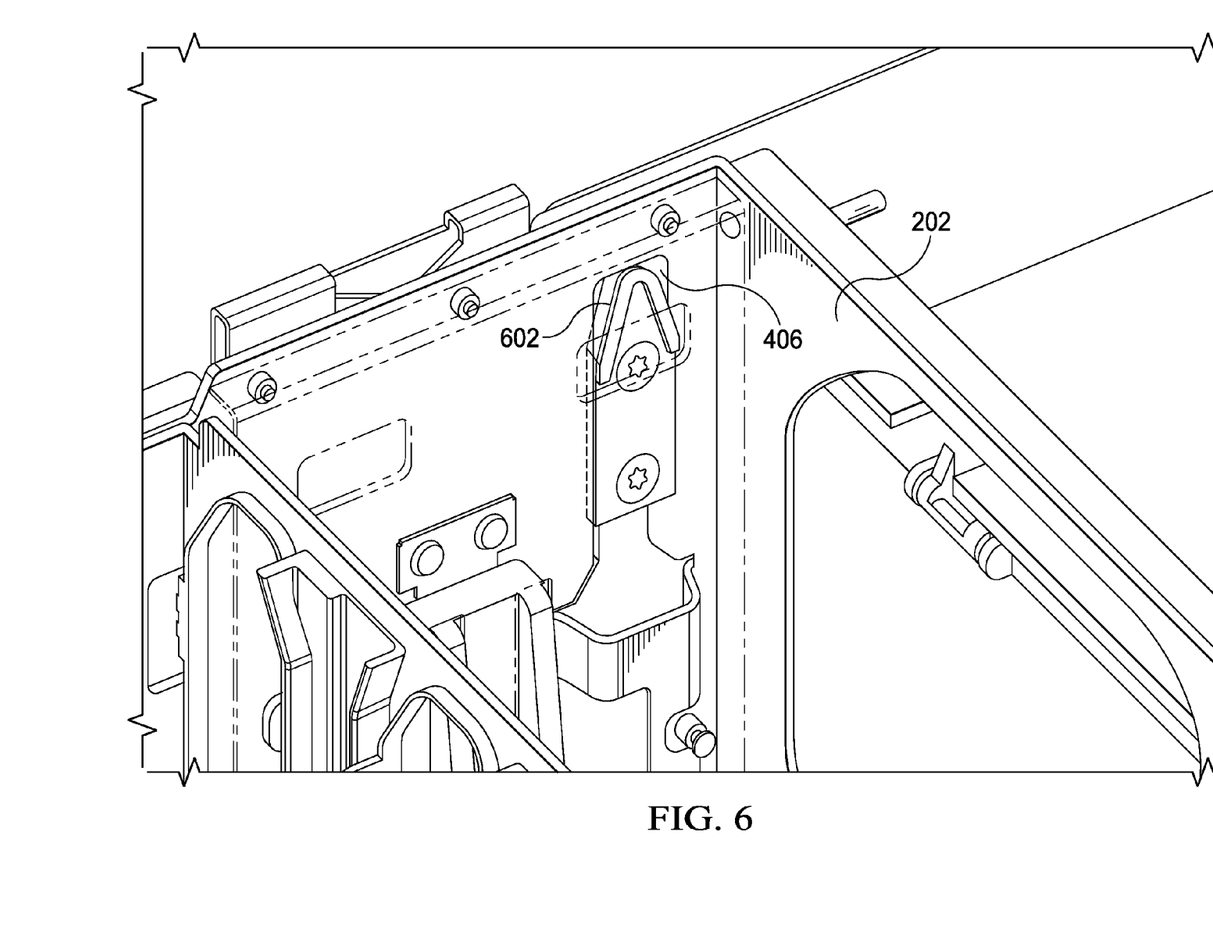
FIG. 6 illustrates a guide slot of the example subassembly of FIGS. 4A and 4B engaged with a corresponding guide of a chassis, in accordance with embodiments of the present disclosure.
Figure 7:
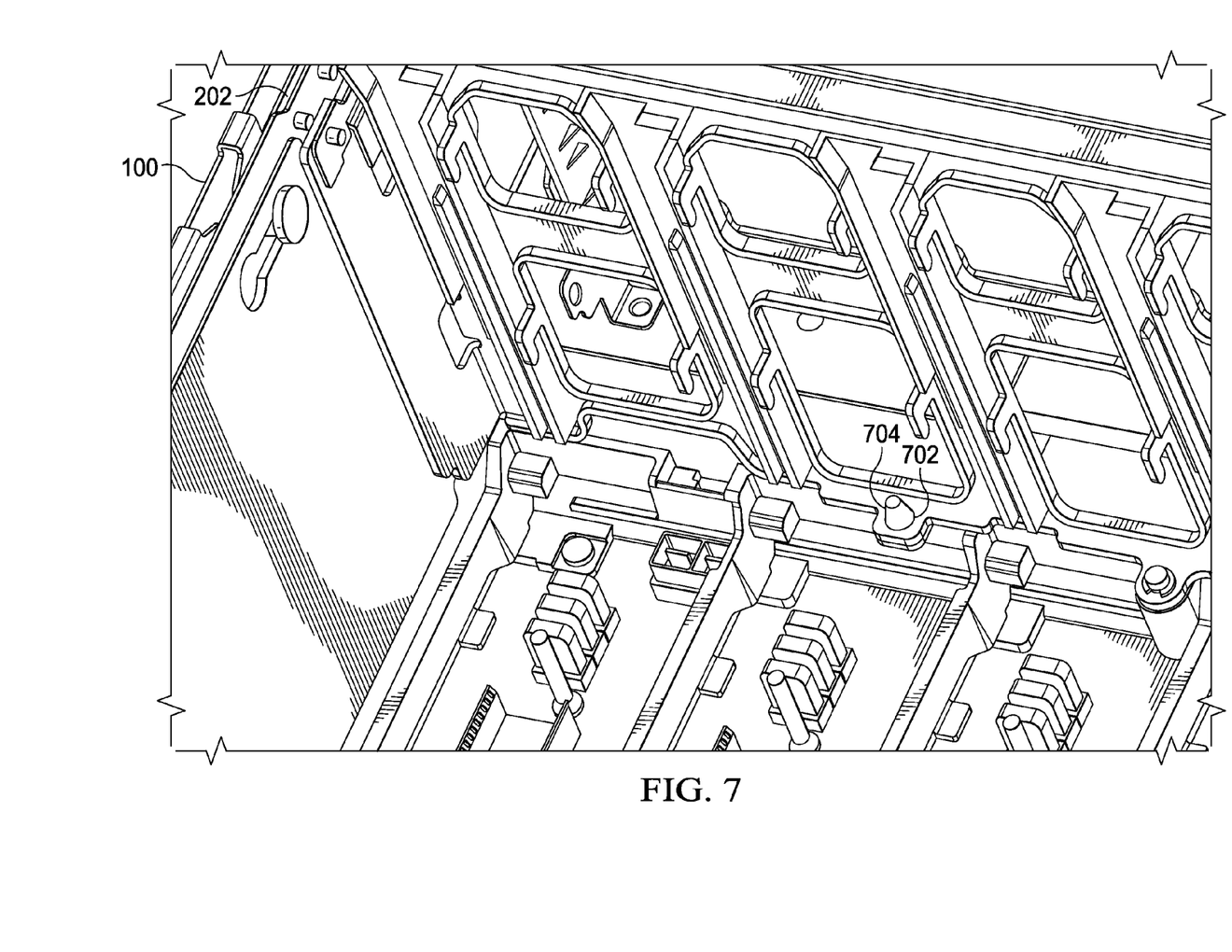
FIG. 7 illustrates an opening of the example subassembly of FIGS. 4A and 4B engaged with a corresponding conical post of a chassis, in accordance with embodiments of the present disclosure.

As another example, subassembly 202 may include one or more guide slots 406 configured to engage with a corresponding feature of chassis 100 to mechanically guide subassembly 202 within chassis 100 during insertion and removal of subassembly 202. Such engagement is depicted in FIG. 6, which shows a guide slot 406 engaged with a corresponding guide 602 of chassis 100 to guide subassembly 202 during insertion into and removal from chassis 100. During insertion of subassembly 202 into chassis 100, guide slots 406 and corresponding guides 602 may provide coarse alignment of subassembly 202 within chassis 100. Turning to FIG. 7, to provide fine alignment of subassembly 202 within chassis 100, subassembly 202 may include one or more openings 702 at the bottom thereof to engage with a corresponding conical post 704 of chassis 100 or formed on a base structure itself mechanically coupled to chassis 100.

Figure 8:
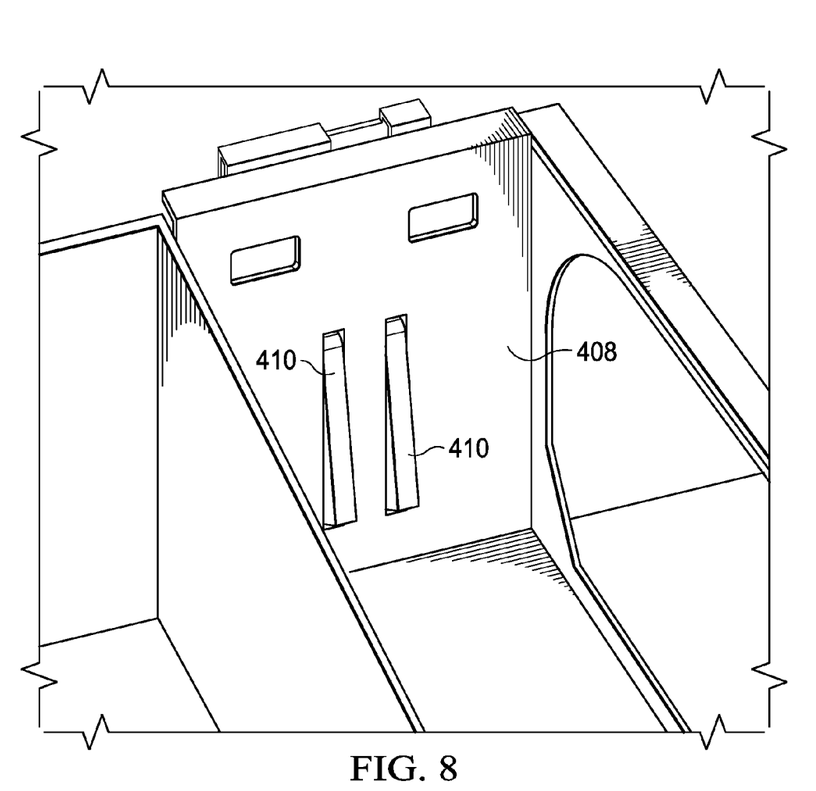
FIG. 8 illustrates a perspective view of a portion of the subassembly of FIGS. 4A and 4B, in accordance with embodiments of the present disclosure.
Figure 9:
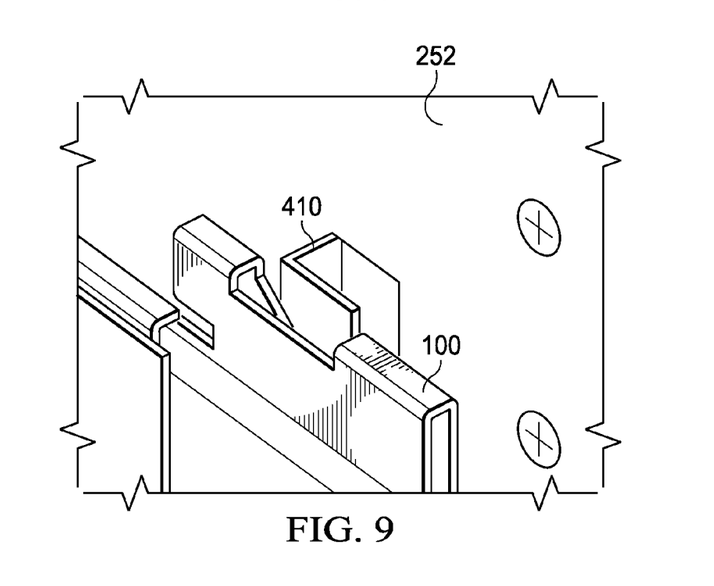
FIG. 9 illustrates perspective view of another portion of the subassembly of FIGS. 4A and 4B, in accordance with embodiments of the present disclosure.

Turning again to FIGS. 4A and 4B and also as shown in FIG. 8, as a further example, subassembly 202 may include one or more lockout features 410 configured to engage with a corresponding feature of chassis 100 in order to retain subassembly 202 in chassis 100 when an information handling resource is disposed in subassembly 202. For example, each of one or more of air mover bays 408 of subassembly 202 may include one or more lockout features 410. When an air mover 122 is inserted in a corresponding bay 408, such air mover 122 may activate a lockout feature 410 such that a portion of lockout feature 410 protrudes through a corresponding hole of subassembly 202 as is shown in more detail in FIG. 9. If lockout feature 410 is activated while subassembly 202 resides in chassis 100, lockout feature 410 may engage with chassis 100 preventing removal of subassembly 202 from chassis 100 while an air mover 122 remains in a bay 408 which has such lockout feature 410. On the other hand, if lockout feature 410 is activated while subassembly 202 resides outside of chassis 100, lockout feature 410 may engage with chassis 100 if insertion is attempted, thus preventing insertion of subassembly 202 into chassis 100 while an air mover 122 remains in a bay 408 which has such lockout feature 410.

Referring again to FIGS. 4A and 4B, subassembly 402 may also include alignment features 414 for receiving corresponding features of a cover of chassis 100.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A structural subassembly for use in an information handling system chassis, comprising:
 a first portion configured to receive one or more of a first type of information handling resource;
 a second portion configured to receive one or more of a second type of information handling resource;
 a common wall, extending, substantially perpendicularly, between substantially parallel first and second end walls, the common wall dividing the first portion from the second portion; and one or more mechanical features configured to engage with one or more respective mechanical features of the information handling system chassis in order to perform at least one of:
    guiding of the subassembly relative to the information handling system chassis during insertion or removal of the subassembly into or from the information handling system chassis; and
    retention of the subassembly relative to the information handling system chassis;
wherein the one or more mechanical features comprise:
    a lockout feature configured to:
        automatically activate responsive to receipt of an information handling resource in the subassembly in order to retain the subassembly relative to the information handling system chassis; and
        prevent insertion of the subassembly into the information handling system chassis when an information handling resource is received in the subassembly; and
    a handle including a first handle member mechanically coupled to a first pair of standoffs protruding from the first end wall and a second handle member mechanically coupled to a second pair of standoffs protruding from the second end wall, wherein the standoffs are configured to engage with a corresponding slots of the information handling system chassis in order to retain the subassembly relative to the information handling system chassis.

2. The structural subassembly of claim 1, wherein the handle is configured such that:
    in a closed position of the handle, the standoff engages with the slot to retain the subassembly relative to the information handling system chassis; and
    in an open position of the handle, the standoff is in a position to pass through an opening in the slot as the subassembly is inserted into or removed from the information handling system chassis.

3. The structural subassembly of claim 1, the one or more mechanical features comprising a guide slot formed in the subassembly and configured to engage with a corresponding guide of the information handling system chassis to guide the subassembly relative to the information handling system chassis during insertion or removal of the subassembly into or from the information handling system chassis.

4. The structural subassembly of claim 1, the one or more mechanical features comprising an opening at a bottom of the subassembly configured to engage with a corresponding conical post of the chassis or a mechanical structure coupled to the chassis to align the subassembly relative to the information handling system chassis.

5. The structural subassembly of claim 1, wherein the first type of information handling resource is a memory riser.

6. The structural subassembly of claim 1, wherein the second type of information handling system is an air mover.

7. The method of claim 1, wherein the handle is configured such that:
    in a closed position of the handle, the standoff engages with the slot to retain subassembly relative to the information handling system chassis; and
    in an open position of the handle, the standoff is in a position to pass through an opening in the slot as the subassembly is inserted into or removed from the information handling system chassis.

8. A method comprising:
providing a structural subassembly for use in an information handling system chassis, the subassembly comprising a first portion configured to receive one or more of a first type of information handling resource and a second portion configured to receive one or more of a second type of information handling resource;
providing a common wall, extending, substantially perpendicularly, between substantially parallel first and second end walls, the common wall dividing the first portion from the second portion; and
providing within the subassembly one or more mechanical features configured to engage with one or more respective mechanical features of the information handling system chassis in order to perform at least one of:
    guiding of the subassembly relative to the information handling system chassis during insertion or removal of the subassembly into or from the information handling system chassis; and
    retention of the subassembly relative to the information handling system chassis;
wherein the one or more mechanical features comprise:
    a lockout feature configured to:
        automatically activate responsive to receipt of an information handling resource in the subassembly in order to retain the subassembly relative to the information handling system chassis; and
        prevent insertion of the subassembly into the information handling system chassis when an information handling resource is received in the subassembly; and
    a handle including a first handle member mechanically coupled to a first pair of standoffs protruding from the first end wall and a second handle member mechanically coupled to a second pair of standoffs protruding from the second end wall, wherein the standoffs are configured to engage with a corresponding slots of the information handling system chassis in order to retain the subassembly relative to the information handling system chassis.

9. The method of claim 8, the one or more mechanical features comprising a guide slot formed in the subassembly and configured to engage with a corresponding guide of the information handling system chassis to guide the subassembly relative to the information handling system chassis during insertion or removal of the subassembly into or from the information handling system chassis.

10. The method of claim 8, the one or more mechanical features comprising an opening at a bottom of the subassembly configured to engage with a corresponding conical post of the chassis or a mechanical structure coupled to the chassis to align the subassembly relative to the information handling system chassis.

11. The method of claim 8, wherein the first type of information handling resource is a memory riser.

12. The method of claim 8, wherein the second type of information handling system is an air mover.

13. An information handling system comprising:
a chassis; and
a structural subassembly comprising:
    a first portion configured to receive one or more of a first type of information handling resource;
    a second portion configured to receive one or more of a second type of information handling resource;
    a common wall, extending, substantially perpendicularly, between substantially parallel first and second end walls, the common wall dividing the first portion from the second portion; and one or more mechanical features configured to engage with one or more respective mechanical features of the chassis in order to perform at least one of:
  guiding of the subassembly relative to the chassis during insertion or removal of the subassembly into or from the chassis; and
  retention of the subassembly relative to the chassis;
wherein the one or more mechanical features comprise:
  a lockout feature configured to:
    automatically activate responsive to receipt of an information handling resource in the subassembly in order to retain the subassembly relative to the chassis; and
    prevent insertion of the subassembly into the information handling system chassis when an information handling resource is received in the subassembly; and
  a handle including a first handle member mechanically coupled to a first pair of standoffs protruding from the first end wall and a second handle member mechanically coupled to a second pair of standoffs protruding from the second end wall, wherein the standoffs are configured to engage with a corresponding slots of the information handling system chassis in order to retain the subassembly relative to the information handling system chassis.

14. The information handling system of claim 13, wherein the one or more mechanical features further comprise at least one of:
  a guide slot formed in the subassembly and configured to engage with a corresponding guide of the chassis to guide the subassembly relative to the chassis during insertion or removal of the subassembly into or from the chassis; and
  an opening at a bottom of the subassembly configured to engage with a corresponding conical post of the chassis to align the subassembly relative to the chassis.

* * * * *